(12) United States Patent
Beigel

(10) Patent No.: US 7,187,055 B2
(45) Date of Patent: Mar. 6, 2007

(54) RECTIFYING CHARGE STORAGE ELEMENT

(75) Inventor: Michael L. Beigel, Encinitas, CA (US)

(73) Assignee: Precision Dynamics Corporation, San Fernando, CA (US)

( * ) Notice: Subject to any disclaimer, the term of this patent is extended or adjusted under 35 U.S.C. 154(b) by 83 days.

(21) Appl. No.: 11/193,067

(22) Filed: Jul. 28, 2005

(65) Prior Publication Data

US 2006/0060940 A1 Mar. 23, 2006

Related U.S. Application Data

(60) Division of application No. 10/895,434, filed on Jul. 1, 2003, now Pat. No. 6,982,452, which is a continuation-in-part of application No. 10/155,518, filed on May 24, 2002, now Pat. No. 6,642,782, which is a continuation of application No. 09/723,897, filed on Nov. 28, 2000, now Pat. No. 6,414,543.

(51) Int. Cl.
*H01L 29/00* (2006.01)

(52) U.S. Cl. .................. 257/532; 257/80; 257/471; 257/535; 257/E29.001

(58) Field of Classification Search ................ 257/532, 257/535, 80, 471, E29.001
See application file for complete search history.

(56) References Cited

U.S. PATENT DOCUMENTS

| | | | |
|---|---|---|---|
| 3,813,927 A | 6/1974 | Furgason | |
| 3,840,800 A | 10/1974 | Laupman | |
| 4,333,072 A | 6/1982 | Beigel | |
| 5,731,691 A | 3/1998 | Noto | |
| 5,854,117 A | 12/1998 | Huisman et al. | |
| 5,915,197 A | 6/1999 | Yamanaka et al. | |
| 5,973,598 A | 10/1999 | Beigel | |
| 6,037,718 A | 3/2000 | Nagami | |
| 6,087,196 A | 7/2000 | Sturm et al. | |
| 6,187,061 B1 * | 2/2001 | Amatucci et al. | 29/25.03 |
| 6,414,543 B1 | 7/2002 | Beigel et al. | |
| 6,593,620 B1 * | 7/2003 | Hshieh et al. | 257/335 |
| 6,924,691 B2 * | 8/2005 | Beigel | 327/509 |
| 7,031,182 B2 * | 4/2006 | Beigel et al. | 365/149 |

\* cited by examiner

*Primary Examiner*—T. N. Quach
(74) *Attorney, Agent, or Firm*—Kelly Lowry & Kelley LLP

(57) ABSTRACT

An electronic device or signal processing device consists of a rectifier and capacitor which share common elements facilitating the construction and application of the device to various types of substrates and, particularly, flexible substrates. Components of the device may be fabricated from organic conductors and semiconductors.

31 Claims, 8 Drawing Sheets

RECTIFYING CHARGE STORAGE ELEMENT

This is a division of U.S. Ser. No. 10/895,434, filed Jul. 1, 2003, now U.S. Pat. No. 6,982,452, which is a continuation-in-part of U.S. Ser. No. 10/155,518, filed May 24, 2002, and published as Publication No. US 2002/0140500 A1 on Oct. 3, 2002, now U.S. Pat. No. 6,642,782, which in turn is a continuation of U.S. Ser. No. 09/723,897, filed Nov. 28, 2000, and now issued as U.S. Pat. No. 6,414,543 on Jul. 2, 2002.

BACKGROUND OF THE INVENTION

This invention relates a rectifying charge storage element and, more particularly, to electronic circuits fabricated on various substrates, including flexible substrates by various means including printing or other deposition techniques using organic conductors, semiconductors and insulators and other electronic materials suitable for deposition and use in electronic circuits. The invention specifically relates to a power supply that extracts DC power (voltage and current) sufficient to power an electronic device from an AC input signal. The AC input signal may be derived from an inductive, capacitive, or L-C resonant circuit coupled to an external electromagnetic or electrostatic AC field. The electronic circuit thus powered may be a radio frequency identification (RFID) circuit.

Most electronic circuits require a source of DC voltage with sufficient current output to power the circuit elements. Many of these circuits derive DC power by rectifying and filtering an AC power signal Often, the AC signal is provided to the circuitry by electromagnetic coupling.

For example, a passive RFID tag system must be capable of receiving power from an RFID reader to the RFID tag via an inductive (H-field) or electric field (E-field) coupling, and transmitting data from the tag to the reader also via inductive or electric field coupling. Activation field frequency of RFID devices may be from under 100 kHz up to over 30 MHz if inductive or capacitive coupling is utilized, and up to the microwave region if electric field RF antenna coupling is used. In current industry practice, operating power to a passive RFID tag or other electronic circuit is derived by utilizing a rectifier device and a charge-storage device, typically a rectifier diode or combination of diodes connected to a charge storage capacitor or combination of capacitors. In the past, these elements have been implemented as separate components within a discrete circuit or silicon integrated circuit.

Recent advancements in circuitry manufacturing processes, applicable to RFID tags and other similar electronic circuit systems, have enabled the production of electronic circuits on flexible substrates using thin film materials such as organic and polymer semiconductors and other substances that can be applied by techniques such as ink jet printing. A primary objective is to produce electronic devices that have operating characteristics similar to discrete or integrated silicon circuit technology while approaching the economy of printing processes.

Beigel, U.S. Pat. No. 4,333,072 describes an inductively coupled RFID system in which power to an RFID tag is derived from an alternating magnetic field originating in a reader-energizer coupled inductively to the tag antenna, and rectified by a rectifier in the antenna with the resulting DC charge stored in a capacitor in the tag.

Beigel, U.S. Pat. No. 5,973,598 describes an RFID tag formed on a flexible substrate by depositing or printing conductive, semiconductive and insulating substances in an operative pattern on the substrate.

Sturm et al, U.S. Pat. No. 6,087,186 describes the fabrication of electronic circuits on flexible substrates by ink jet printing methods. U.S. Pat. No. 6,037,718 describes an organic transistor stacked on an electroluminescent display element. U.S. Pat. No. 5,915,197 describes a "varicap" diode formed by silicon processes.

SUMMARY OF THE INVENTION

An object of the invention is the provision of a composite device that provides rectification and charge storage for converting AC signals to DC power supply voltages by structurally combining a rectifier diode and charge storage capacitor.

An additional object of the invention is the provision of a composite power supply which incorporates a diode rectifier and a capacitor, said rectifier and capacitor sharing a common component to facilitate the provision of the diode and rectifier in a single device.

Another object of the invention is the provision of a device of the aforementioned character which can be provided on a flexible substrate to facilitate the incorporation of the device in correspondingly flexible environments.

A further object of the invention is the provision of a device of the aforementioned character wherein various components of the device may be fabricated from organic and other conductors which constitute the interface between the conductors of the rectifier and capacitor components of the device.

Additionally, the device may incorporate a flexible substrate as an electrically operative component of the device.

BRIEF DESCRIPTION OF THE DRAWINGS

Other objects and advantages of the invention will become apparent from the following specification and the accompanying drawings in which:

FIG. 19 is an enlarged and fragmented sectional view showing encapsulation of the rectifying charge storage element and related electronic circuitry with flexible substrate layers suitable for use, for example, as a wristband or the like.

DETAILED DESCRIPTION OF THE PREFERRED EMBODIMENTS

Figure 1:
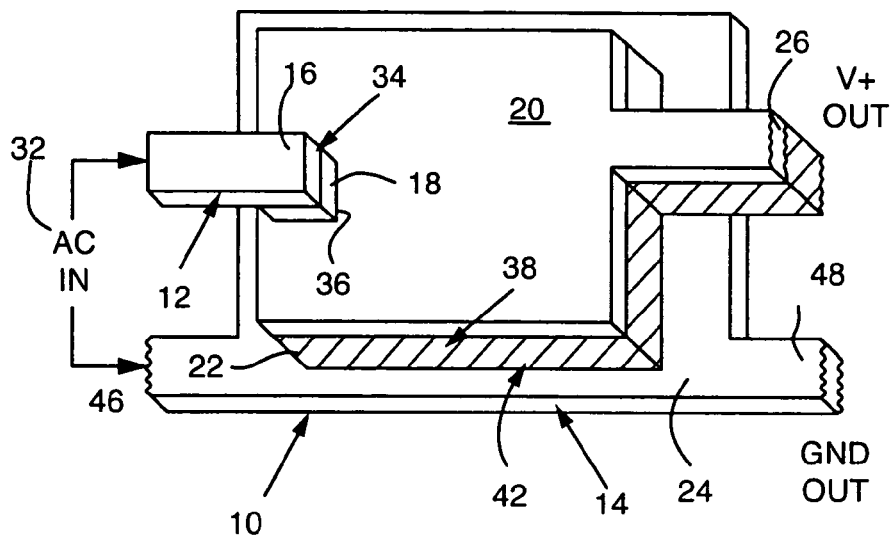
FIG. 1 shows a device constructed in accordance with the teachings of the invention.

Referring to the drawings and particularly to FIG. 1 thereof, a power supply device 10 is shown to include a diode rectifier 12 and a capacitor 14. The diode 12 includes a conductor 16 and a semiconductor 18. A common conductor 20 between the diode 12 and capacitor 14 is superimposed on a dielectric component 22 of the capacitor 14 which, in turn, is mounted on a conductor 24.

The conductor 16 is shown electrically connected to one terminal 30 of the AC source 32 and electrically connected to one surface of the semiconductor 18 at the surface interface 34. The opposite surface of the semiconductor 18 is electrically connected to the common conductor 20 at the surface interface 36. The common conductor 20 is connected to the dielectric component 22 at surface interface 38 and the conductor 24 is connected to the dielectric component 22 at the surface interface 42. The conductor 24 is connected to the other terminal 46 of the AC source 32 and also serves as the ground output terminal 48.

Rectification takes place between the conductor 16, the semiconductor 18, and the common conductor 20 through the interfaces 34 and 36. Charge storage takes place between the common conductor 20, the dielectric component 22, and the conductor 24. The surface area of the rectifying component and 16, 34, 18, 36, and 20 interfaces may if desired be minimized to reduce internal parasitic capacitor characteristics inherent in rectification. The surface area of the capacitive component interface provided by the common conductor 20 may if desired be maximized to increase DC charge storage capacity. In a power supply application, the common conductor 20 provides the DC power at a junction 26 and the circuit being powered by the device 10 may be energized thereby inductively, magnetically, or directly.

The diode component may be fabricated from various materials, including inorganic semiconductor nanocrystals such as CdSe, InP, and others. Furthermore, conjugated polymers may be used, such as poly(phenylene-vinylene) (PPV), its derivatives and co-polymers (such as MEH-PPV (poly(2-methoxy, 5-(2'-ethyl-hexoxy)-p-phenylene vinylene))); polyfluorene (PF), its derivatives and co-polymers; polyparaphenylene (PPP), its derivatives and co-polymers; polythiophene (PT), its derivatives and co-polymers; and others. Alternative organic semiconductors, referred to as high performance organic semiconductor devices, are shown and described in copending U.S. Ser. No. 10/218,141, filed Aug. 12, 2002, and incorporated by reference herein.

The rectifying function of the diode 12 is implemented through the conductor 16 which serves as the anode and the common conductor 20 which serves as the cathode. The rectifying character of an organic or a polymeric diode usually requires different conductors for the anode and for the cathode. Organic and polymeric semiconductors are usually regarded as semiconductors with low doping concentration (usually in the range of $\sim 10^{13}$ cm$^{-3}$), hence the theory of p-n junction commonly used inorganic semiconductor diodes is not applicable here.

For inorganic diodes, metal electrodes for the anode and cathode can be the same material with ohmic contacts to the p-type and n-type semiconductor, respectively. The rectifying behavior is from the p-n junction.

For organic semiconductors, the relative position of the work functions (or the energy level) of the metal electrodes to the energy levels of the conduction band and valence band of the organic semiconductor determines the rectifying behavior. The choice of anode hence is preferentially to be high work function metals such as gold, nickel, and their alloys. Alternatively, some metal oxides, including but not limited to indium tin-oxide, indium oxide, are also candidates for the anode material. For the cathode, the choice is preferentially low work function metals, including but not limited to calcium, lithium, magnesium, and others. Recently, the metal alloys consisting of a small amount of low work function metals, such as aluminum:lithium 3% alloy and 97% Al:LiF bilayer electrode, have become alternatives for the choice of cathode material.

In the case where the conductor 16 is formed from a relatively high work function metal such as a thin layer of aluminum or gold, a layer of low work function material is used for the common conductor 20. In this configuration, the conductor 16 comprises the anode connection to the semiconductor or diode component 18, with the common conductor 20 comprising the cathode connection. Conversely, when the conductor 16 is formed from a low work function material, the common conductor 20 should be formed from a comparatively high work function metal such as aluminum or gold. In this latter configuration, the common conductor 20 comprises the anode connection for the semiconductor 18, and conductor 16 comprises the cathode connection.

The materials for the capacitor dielectric 22 should be insulating materials, preferentially with a high dielectric constant to enhance its capacity. The structure of the capacitor 14 should provide a larger area compared to the diode. The dielectric 22 may be an organic or polymeric or inorganic insulator with reasonable dielectric constant. It should be large enough to hold enough charge, and it should also be small enough such that the device 10 has a fast response time. Currently, polymer materials such as polystyrene, polyethylene, and polycarbonate are ideal candidates. The dielectric 22 should be flexible where the other components of the device 10 are flexible.

The device 10 may be fabricated according to traditional polymer and organic device fabrication processes. In this regard, polymer and organic thin films can be processed by spin-coating, ink-jet printing, roll-to-roll coating, and other coating methods. Organic thin films can also be deposited by thermal sublimation, chemical vapor deposition, and analogous methods. Metal electrodes can be deposited on a substrate by thermal deposition under high vacuum or by the ink-jet printing process. Where conventional materials are utilized, the components of the device 10 can be assembled by the use of materials and processes well known to those skilled in the art.

In alternative configurations, the composite device 10 may be mounted onto a suitable substrate (not shown in FIG. 1) which may comprise a flexible substrate. Or, if desired, the substrate which may be flexible can be formed by a portion of the composite device 10, such as by incorporating the substrate directly into the dielectric component 22. Alternatively, or additionally, the dielectric component 22 may be defined by a combination semiconductor and dielectric layer for performing the dual functions of rectification and insulation between the capacitor plates. Any or all of these features may be incorporated into a planar array, and may further include capacitor plates having an interdigitated configuration.

In addition, the diode and capacitor components of the composite device 10 may take a variety of different specific forms, including but not limited to a light responsive or light emitting diode, a schottky diode, a light responsive or light emitting capacitor, a supercapacitor, an electret capacitor, and others.

Figure 2:
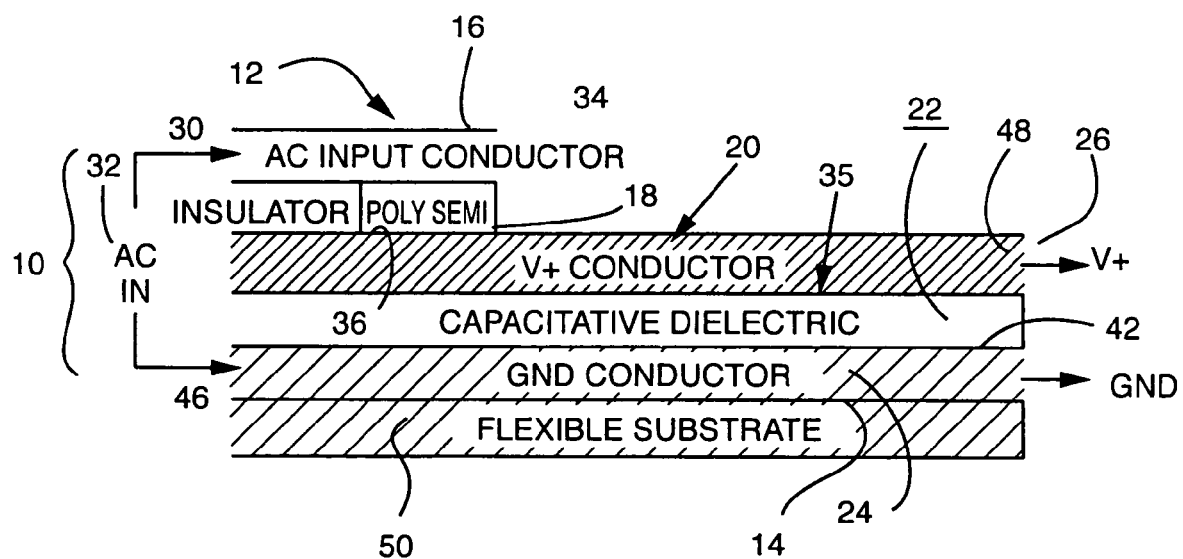
FIG. 2 is a sectional view showing the device mounted on a flexible substrate.
Figure 3:
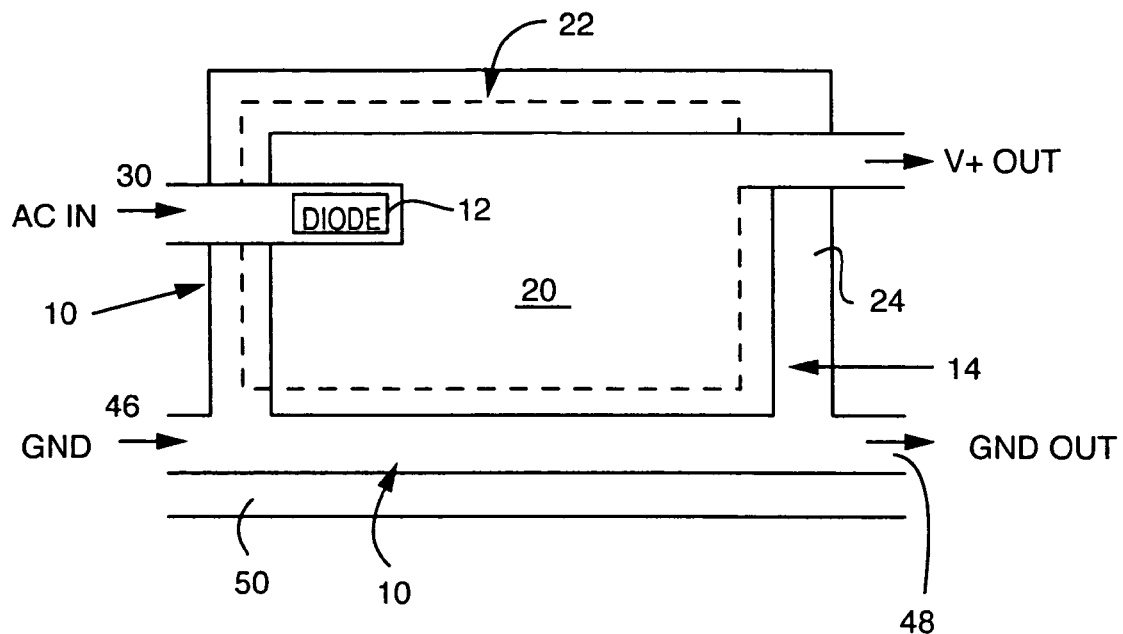
FIG. 3 is a plan view of the device of FIG. 2.

More particularly, the device 10 of FIG. 1 is shown in FIG. 2 as mounted on a flexible substrate 50 with all of the other components of the device 10 being the same reference numerals as the device 10 of FIG. 1. FIG. 3 is a top plan view of the device 10 of FIG. 2 and shows the device 10 superimposed on the top surface of the flexible substrate 50. The flexible substrate 50 may be manufactured from any type of material. Where a flexible substrate, such as the substrate 50, is provided, it is desirable that all of the components of the device 10 be correspondingly flexible so that the device 10 may be mounted, through the flexible substrate 50, in environments where such flexibility is indicated. Typical substrates are sheets or strips of polyethylene, polyvinylchloride, or the like.

Figure 4:
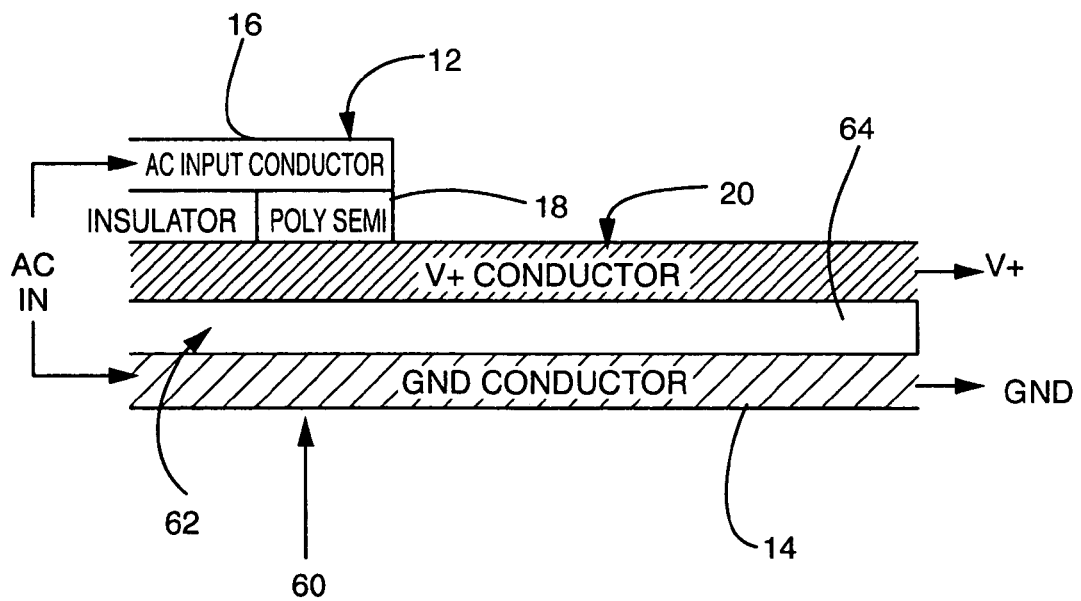
FIG. 4 is a sectional view showing the incorporation in the device of a flexible substrate.
Figure 5:
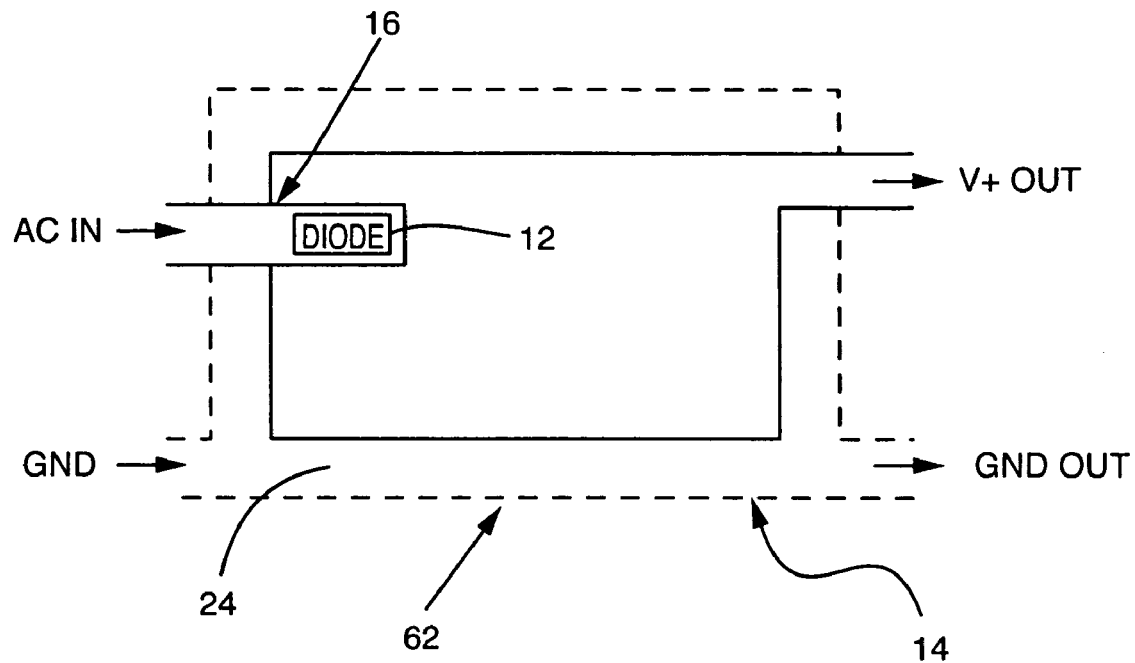
FIG. 5 is a top plan view of the device of FIG. 4.

An alternative embodiment 60 of the device 10 is shown in FIG. 4 in cross section and includes elements identical with or similar to the corresponding elements of FIGS. 1–3, said elements being provided with the same reference numerals as those of FIGS. 1–3. The major difference between the device 60 of FIG. 4 and the device 10 lies in the provision of a dielectric 62 which is incorporated in a flexible substrate 64. Once again, the flexible substrate can be manufactured from strip or sheet plastic material such as polyvinylchloride, polystyrene, polyethylene, and the like. The device of FIG. 4 is shown in plan view in FIG. 5. Although the flexible substrate 62 is shown as protruding beyond the limits of the remaining elements of the device 60, it is not intended that the actual commercial device be limited to that particular configuration since it is contemplated that the devices be extremely miniaturized.

Figure 6:
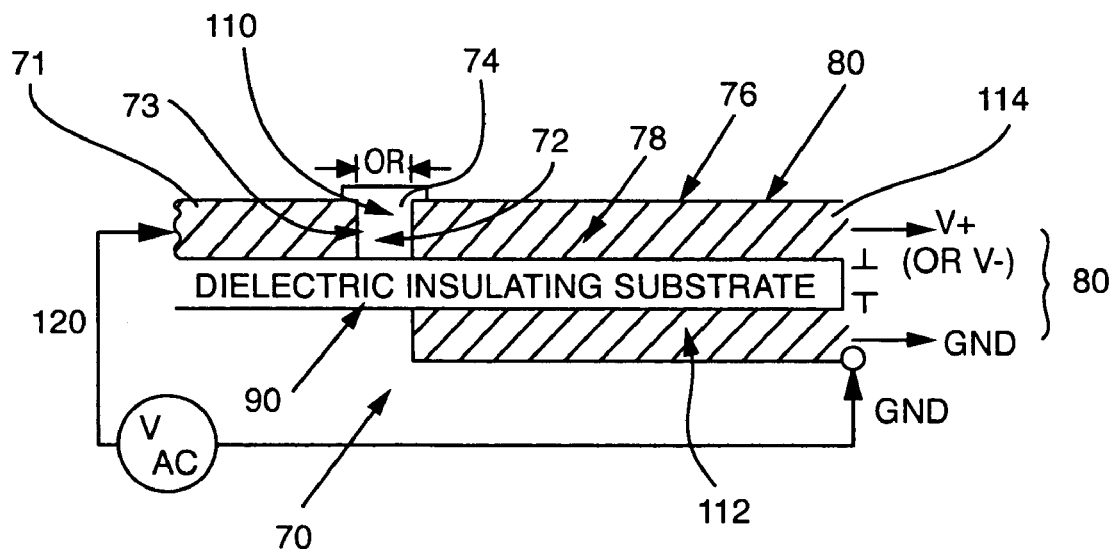
FIG. 6 is a view of an alternative embodiment of the device of the invention.

An alternative embodiment 70 of the power supply device 10 is shown in FIG. 6 and functions in the same manner as the devices of FIGS. 1–5. However, the various elements of the embodiment 70 are disposed in planar rather than a superimposed relationship which is characteristic of the previously discussed embodiments of FIGS. 1–5. This planar relationship of the various components minimizes the rectifier capacitance of the diode and also provides for various advantages in device fabrication. The device 70 incorporates a conductive layer 71 having a low work function and terminating to create a gap 72. The conductive layer 71 forms the anode terminal 73 of the rectifying diode 74.

A common conductive layer 76 having a high work function and larger surface area than the first conductive layer 71 is provided at the gap 72 and constitutes the cathode of the diode 74 as well as the top layer 78 of the capacitor 80. A dielectric substrate 90 is provided below the conductors 71 and 76 and an organic molecular semiconductor 110 is provided across the gap and permits the performance of the rectifier function of the device 70.

A conductive layer 112 underlies the dielectric substrate 90 and the completion of the capacitor 70 is accomplished. An AC circuit 120 is connected at one side to the conductive layer 71 and at the opposite side to the layer 112 which acts as the ground of the circuit. The DC output is located at 114 on the common conductive layer 76.

The planar structure of the device 70 permits the formation of a power supply of opposite polarity by using opposite combinations of high and low work function conductors such as the layers 71 and 76.

Figure 7:
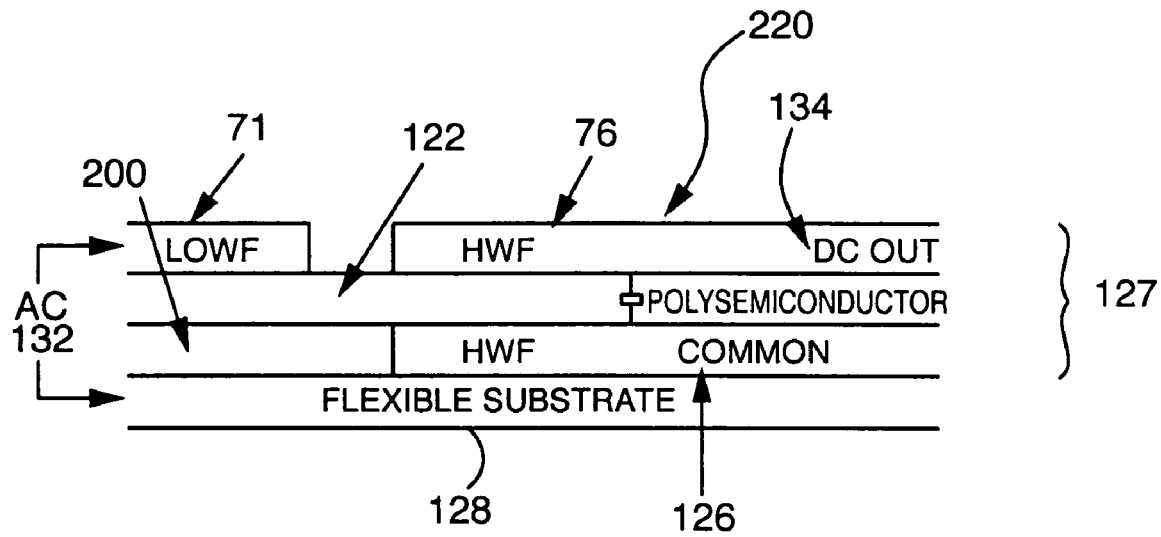
FIG. 7 is a sectional view of another embodiment of the invention.

An alternative planar device 220 is shown in FIG. 7 as including the layers 71 and 76 of the device 70 of FIG. 6. However, instead of incorporating the flexible dielectric 110 of the device 70, a common layer 122 is provided which serves as a semiconductor connection to the common layer 76 and as a dielectric between the common layer 76 and a second conductive layer 126 of a capacitor component 127. Accordingly, in this embodiment, there are two elements of the device 220 serving a common function, namely, the semiconductor/dielectric layer 122 and the common conductive layer 76. The layer 126 is a high work function layer and serves as the ground for the circuit of the device 220. The provision of the coplanar layers 71 and 76 and the common performance of the layer 76 and the layer 122 greatly simplify the fabrication of the device 120 on the flexible substrate. There is an air gap 200 or other insulating, layer between the poly-semiconductor 122 and the flexible substrate 128. This air gap 200 is adjacent to the layer 126. The AC input 132 is connected on one side to the anode layer 71 and on the other side to the common conductor layer 76 with the DC output being connected to the layer 76 at 134.

Figure 9:
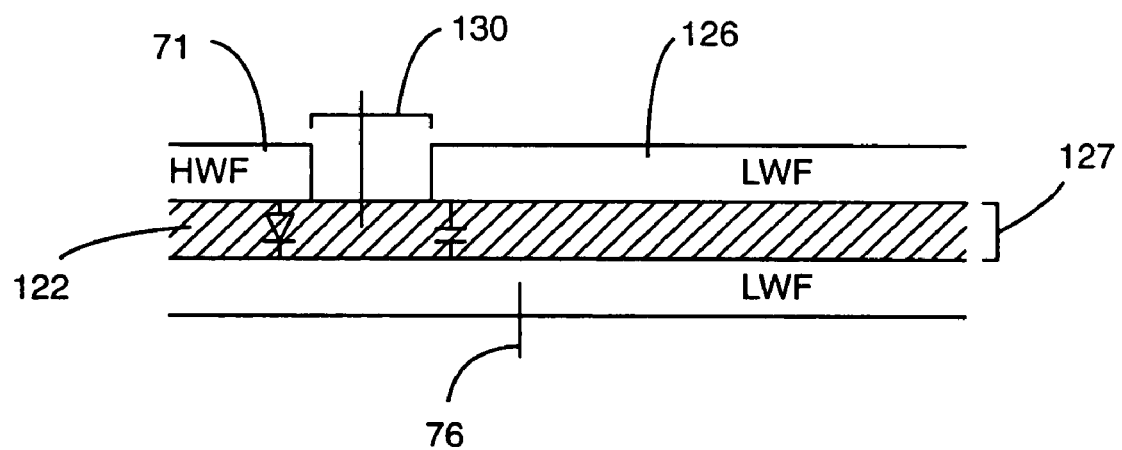
FIG. 9 is a sectional view illustrating a further alternative preferred form of the invention, similar to the embodiment depicted in FIG. 7.
Figure 10:
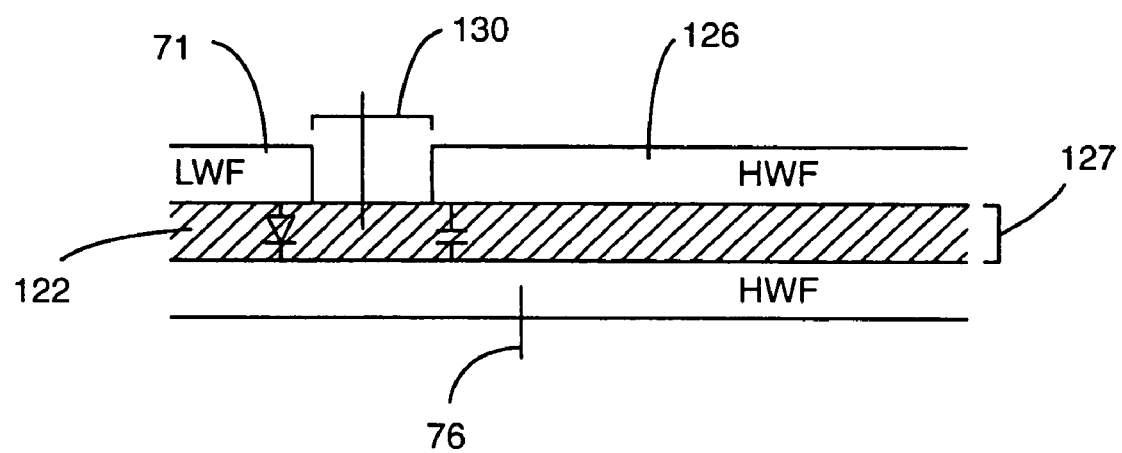
FIG. 10 is a sectional view showing another alternative preferred form of the invention, similar to the embodiment depicted in FIG. 9, but with an alternative arrangement of conductive materials having different work functions.

FIGS. 9 and 10 are simplified sectional views generally similar to the embodiments depicted in FIGS. 6 and 7, to illustrate the arrangement of conductive materials having different work functions in a rectifying charge storage element using a combined semiconductor/dielectric layer as described above with respect to FIG. 7. For convenience and consistent reference, FIGS. 9 and 10 incorporate reference numerals common to FIG. 7.

More particularly, in the alternative work function arrangements of FIGS. 9 and 10, the capacitor component 127 is defined by the dielectric layer 122 interposed between the common conductor 76 and a second conductor 126. In addition, by incorporating the semiconductor component, the dielectric layer 122 also defines the diode component of the device in cooperation with an input conductor 71 and the common conductor 76. The input conductor 71 and the second conductor 126 are formed on a common side of the dielectric layer 122, with a substantial gap 130 therebetween. As illustrated, the dielectric layer 122 may further incorporate or comprise the substrate, which may be flexible, although it will be appreciated that the devices shown in FIGS. 9 and 10 may be mounted on or applied to a separate substrate such as a substrate layer of the type shown and described with respect to FIG. 2.

In the embodiment illustrated in FIG. 9, the input conductor 71 is formed from a high work function material, whereas the common conductor 76 and the second conductor 126 are formed from a comparatively low work function material, as previously described herein. In this arrangement, the diode component of the device is forward biased as depicted by the schematic representation of the diode in FIG. 9 within the dielectric layer 122. Conversely, in the arrangement depicted in FIG. 10, the input conductor 71 is formed from a low work function material in comparison with the common and second conductors 76, 126, resulting in reverse biasing of the diode component as depicted by the schematic representation of the diode in FIG. 10 within the dielectric layer 126.

Figure 8:
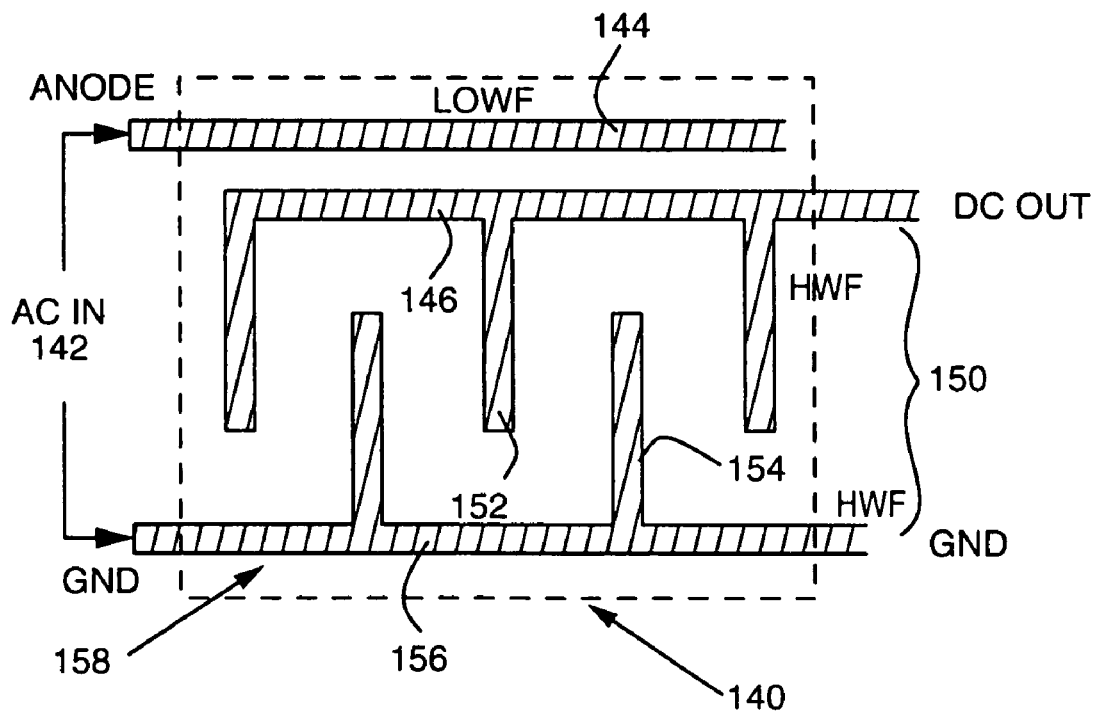
FIG. 8 is a schematic view, in plan, of yet another embodiment of the invention.

Another alternative embodiment 140 of the device is shown in FIG. 8 of the drawings as including an AC input at 142 which is connected to an anode 144. The anode 144 communicates with one side 146 of an interdigitate capacitor unit 150. The interdigitate capacitor layers or fingers 152 of said one side fit between corresponding layers or fingers 154 of the other side 156. The entire assemblage is encapsulated or overlaid by semiconductor/dielectric material 158 to create the rectification and capacitance effects. The device 150 is particularly suited to deposition on a flexible substrate and is susceptible to various well-established methods of deposition conductors such as conductive inks, organic polymers, or the like.

Figure 11:
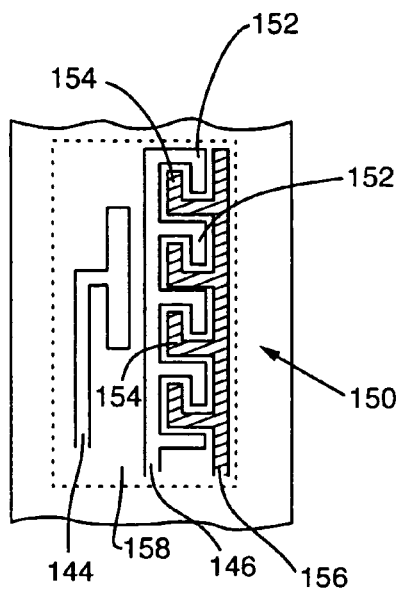
FIG. 11 is a schematic plan view, similar to FIG. 8, depicting a modified interdigitated capacitor having a fractal geometry.

FIG. 11 illustrates a modified configuration similar to FIG. 8, but wherein interdigitate capacitor fingers are arranged in a fractal geometric pattern to increase the overall effective surface area of the capacitor component. More specifically, in the configuration depicted in FIG. 11, components corresponding to those shown and described in FIG. 8 are conveniently identified by the same reference numerals. As shown, an input conductor or anode 144 communicates with one side 146 of the capacitor component 150, including a plurality of fractal-shaped fingers 152 each shown with a generally L-shaped configuration and arranged in a closely spaced, interleaved geometric pattern with a corresponding plurality of matingly fractal-shaped fingers 154 each shown with a generally inverted L-shaped configuration and defining a second or opposite side 156 of the capacitor component 150. This assemblage is encapsulated within or overlaid by semiconductor/dielectric material 158 to provide the desired rectification and capacitance functions. The interleaved closely-spaced geometric pattern defined by the fractal-shaped fingers provides an extended capacitor surface area in an extremely compact or miniaturized electronic device. Persons skilled in the art will recognize and appreciate that alternative interleaved fractal-shaped capacitor finger arrangements may be used.

Figure 12:
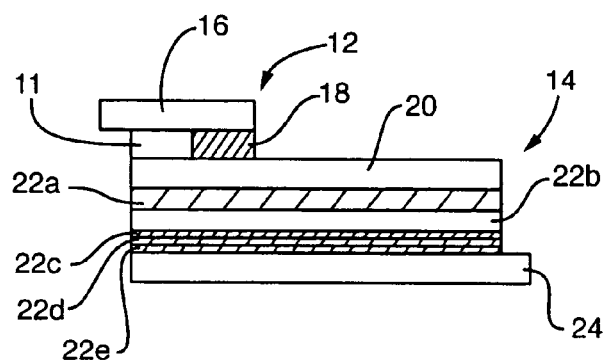
FIG. 12 is a sectional view showing a further alternative preferred form of the invention including an electrolytic capacitor component.

FIG. 12 illustrates a further alternative preferred form of the invention, wherein the capacitor component of the composite rectifying charge storage element comprises an electrolytic capacitive device. For ease and convenience of description, components corresponding in structure and/or function to those previously shown and described herein relative to FIG. 1 will be referred to in FIG. 12 by common reference numerals.

More particularly, as shown, the modified composite device shown in FIG. 12 includes a diode component 12 in the form of a suitable semiconductor 18 such as an organic semiconductor interposed between an input conductor 16 comprising a relatively high work function metal such as gold, and a common conductor 20. A suitable insulator 11 may be interposed between the input and common conductors 16 and 20, at one side of the semiconductor 18, if desired. A capacitor component 14 is defined by the common conductor 20 (shared with the diode component 12) and a second conductor 24, with multiple intervening layers (to be described in more detail) between the common and second conductors 20, 24 to provide the electrolytic capacitor function. In one form, the common and second conductors 20 and 24 may be constructed from a conductive material such as aluminum.

The multiple intervening layers interposed between the conductors 20 and 24 may be constructed according to the electrolytic capacitor as shown and described in U.S. Pat. No. 6,206,937, which is incorporated by reference herein. In this regard, such intervening layers may comprise an upper dielectric film 22a overlying a layer 22b formed from a conductive material such as a manganese oxide, which in turn overlies a sequence of layers shown comprising an optional layer 22c of a conductive polymer such as a thiophene derivative, an electrolyte layer 22d of a conductive polymer such as pyrrole or its derivatives, and a layer 22e of a conductive material such as a thiophene derivative. This arrangement of intervening layers 22a–e formed between the overlying common conductor 20 and the underlying second conductor 24 are shown and described in U.S. Pat. No. 6,206,937. The resultant electrolytic capacitor component of the composite rectifying charge storage element is inherently polarized, i.e., is capable of storing a charge of one polarity.

Figure 13:
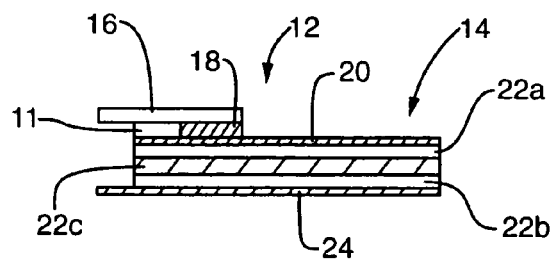
FIG. 13 is a sectional view of another alternative preferred form of the invention including an electrochemical capacitor component.

FIG. 13 depicts another alternative preferred form of the invention, wherein the capacitor component of the composite rectifying charge storage element comprises an electrochemical capacitive device. For ease and convenience of description, components corresponding in structure and/or function to those previously shown and described herein relative to FIG. 1 will again be referred to in FIG. 13 by common reference numerals.

More particularly, as shown, the modified composite device shown in FIG. 13 includes a diode component 12 in the form of a suitable semiconductor 18 such as an organic or polymer semiconductor interposed between an input conductor 16 comprising a relatively high work function metal, and a common conductor 20. A suitable insulator 11 may again be interposed between the input and common conductors 16 and 20, at one side of the semiconductor 18, if desired. A capacitor component 14 is defined by the common conductor 20 (shared with the diode component 12) and a second conductor 24, with multiple intervening layers (to be described in more detail) between the common and second conductors 20, 24 to provide the electrochemical capacitor function. In one form, the common and second conductors 20 and 24 may be constructed from a relatively low work function conductive material such as aluminum.

The multiple intervening layers interposed between the conductors 20 and 24 may be constructed according to the electrochemical capacitor as shown and described in U.S. Pat. No. 6,426,863, which is incorporated by reference herein. In this regard, such intervening layers may comprise relatively thin film and flexible upper and lower active anode and cathode material layers 22a and 22b with an ionically conductive polymer thin film layer 22c having a liquid electrolyte absorbed therein sandwiched between the anode and cathode layers 22a and 22b.

As described in U.S. Pat. No. 6,426,863, the anode and cathode material layers 22a and 22b are preferably formed a combination of materials selected from two different groups, with at least 1% by weight inclusion from each group. The first group comprises activated carbon or a metal oxide or mixture thereof selected from the group consisting of metal oxides consisting of oxides of valve metals, noble metals, and alloys and mixtures thereof. Such materials include oxides of titanium, zirconium, hafnium, niobium, tantalum, molybdenum, tungsten, ruthenium, iridium, platinum, palladium, osmium, gold and rhenium. The second group comprises a polymer material selected from the group including oxides, sulfides, or selenides, including any of $MnO_2$, $LiMn_2O_4$, $Li_xMnO_2$, $MoS_2$, $MoS_3$, $MoV_2O_8$, $CoO_2$, $Li_xCoO_2$, $V_6O_{13}$, $V_2O_5$, $V_3O_8$, $VO_2$, $V_2S_2$, $TiS_{12}$, $NbSe_3$, $Cr_2O_5$, $Cr_3O_8$, $WO_3$, $Li_xNiO_2$, $Li_xNi_yCo_zO_2$, $Li_xCo_yMn_zO_2$, and lithium doped electronically conducting polymers including polypyrrole, polyaniline, and polyacetylene. For example, the anode and cathode layers 22a and 22b could be made of material formed by a 1:1 ratio by weight of $RuO_2$, $IrO_2$, $TaO_2$, and $MnO_2$.

The electrochemical capacitor component 14 (FIG. 13) has relatively high charge storage capability, and is not polarized in one direction. The construction of the electrochemical capacitor component is compatible with the composite rectifying charge storage element and related production process, since common conductor 20 and anode layer 22a may be shared in common with the diode component 12.

Figure 14:
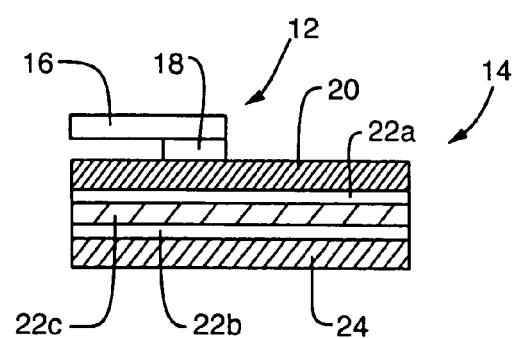
FIG. 14 is a sectional view depicting another alternative preferred form of the invention including a secondary battery as the capacitor component.

FIG. 14 shows another variation of the invention, wherein the capacitor component of the composite rectifying charge storage element comprises a secondary battery. Once again, for ease and convenience of description, components corresponding in structure and/or function to those previously shown and described herein relative to FIG. 1 will be referred to in FIG. 14 by common reference numerals.

As shown, the modified composite device shown in FIG. 14 includes a diode component 12 in the form of a suitable semiconductor 18 such as a polymer semiconductor interposed between an input conductor 16 which may be formed from a relatively high work function metal such as gold, and a common conductor 20 which may be formed from a comparatively lower work function material such as aluminum. A capacitor component 14 is defined by the common conductor 20 (shared with the diode component 12) and a second conductor 24, with multiple intervening thin film and preferably flexible layers (to be described in more detail) between the common and second conductors 20, 24 to provide the battery function. It will be recognized and understood that the above-described arrangement will orient the diode component 12 in a forward biased configuration, whereas reversal of the comparative work functions of the input conductor 16 and the common conductor 20 will orient the diode component 12 is a reverse biased configuration. In either configuration, the conductors 20 and 24 are preferably constructed from a flexible foil.

In the battery embodiment illustrated in FIG. 14, the multiple intervening layers interposed between the conductors 20 and 24 may be constructed according to the secondary battery construction as shown and described in U.S. Pat. No. 4,714,665, which is also incorporated by reference herein. More particularly, the intervening layers may comprise upper and lower polymeric films 22a and 22b each formed from a material that is both ionically and electrically conductive at discharge and recharge voltage levels. An intermediate polymer layer 22c is sandwiched therebetween, wherein this intermediate layer 22c is formed from a polymeric film material that is ionically but not electrically conductive at discharge voltage levels, but is both ionically and electrically conductive at recharge voltage levels.

Figure 15:
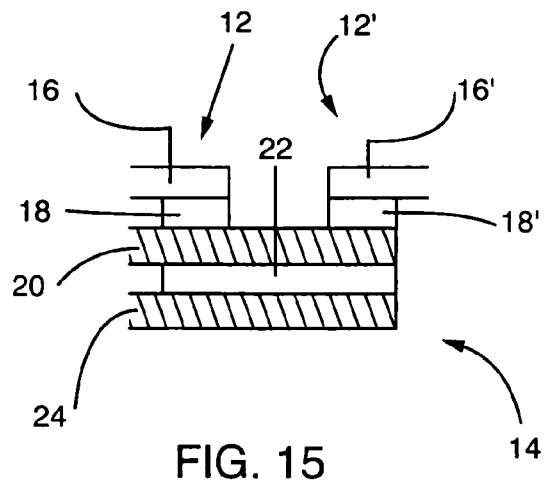
FIG. 15 is another sectional view showing a further alternative preferred form of the invention in the form of a compound rectifying charge storage element having conductive materials with three different work functions.
Figure 16:
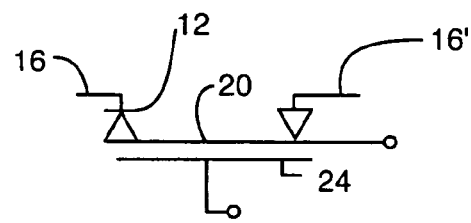
FIG. 16 is a schematic circuit diagram illustrating the compound device of FIG. 15.

Another alternative preferred form of the invention is illustrated in section in FIG. 15, with a corresponding circuit schematic shown in related FIG. 16. In this variation of the invention, a modified rectifying charge storage element is provided with a pair of diode components, and corresponding conductors defining three different work functions. Again, for ease and consistency of description, components corresponding to those shown and described in FIG. 1 are identified by common reference numerals.

As viewed in FIG. 15, the modified composite device incorporates a first diode component 12 such as a polymer or organic semiconductor 18 with an input or anode conductor 16 and having its cathode side connected to a common conductor 20 shared with a capacitor component 14. The capacitor component 14 is again defined by the common conductor 20 and a second conductor 24, with an intervening or intermediate layer 22 of dielectric material. The comparative work functions of the input conductor 16 and the common conductor 20 are such that the diode component 12 is forward biased, i.e., the work function of the input conductor 16 is high relative to the work function of the common conductor 20.

The modified composite device also includes a second diode component identified in. FIG. 15 by the reference numeral 12'. This second diode component 12' includes a polymer or organic semiconductor 18' sandwiched between an input conductor 16' and the common conductor 20 of the capacitor component 14. Importantly, the comparative work functions of the second input conductor 16' and the common conductor 20 are such that the diode component 12' is reverse biased, i.e., the work function of the input conductor 16' is low relative to the work function of the common conductor 20.

With this configuration, the composite rectifying charge storage element including the oppositely biased pair of diode components may be used as a compact rectifier in an electronic circuit application. The first diode component 12 will add charge to the capacitor component 14 when the voltage signal applied via the input conductor 16 exceeds the diode threshold voltage on the common conductor 20 which may be coupled to a suitable ground point. Similarly, the second diode component 12' will drain charge from the capacitor component 14 whenever the voltage at the conductor 16' is negative. If the voltage drop between the two input conductors 16, 16' exceeds the threshold voltage for both diode components 12, 12', current will flow from the first conductor 16 to the second input conductor 16'.

Figure 17:
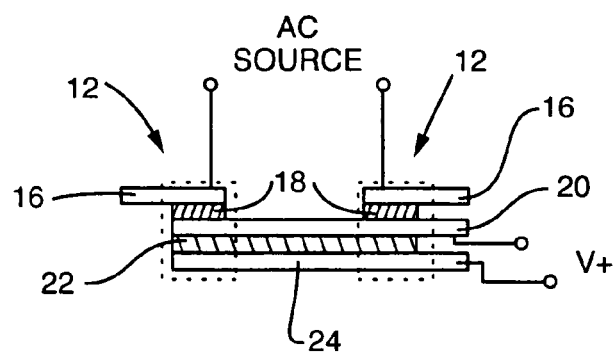
FIG. 17 is another sectional view showing a further alternative preferred form of the invention in the form of a compound rectifying charge storage element for use as a full wave rectifier.
Figure 18:
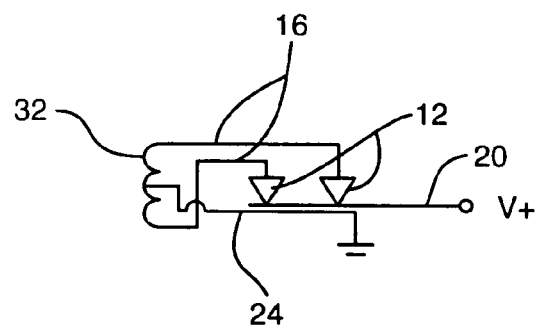
FIG. 18 is a schematic circuit diagram illustrating the compound device of FIG. 17.

FIGS. 17–18 depict a still further alternative preferred form, generally comprising a variation of composite device illustrated in FIGS. 16—16, including a pair of diode components and particularly adapted for connection to an AC source voltage to provide full wave rectification. FIG. 17 depicts the modified composite device in section, whereas FIG. 18 illustrates a counterpart circuit schematic. Components corresponding in function to those shown and described in FIG. 1 are again identified by the same reference numerals.

FIG. 17 shows the modified composite device to include the pair of diode components 12 each including a polymer or organic semiconductor 18 coupled between an input conductor 16 and a common conductor 20 shared with a capacitor component 14. The capacitor component 14 is again defined by the common conductor 20 and a second conductor 24, with an intervening or intermediate layer 22 of dielectric material. The comparative work functions of the two input conductors 16 and the common conductor 20 are such that both of the diode components 12 are oriented in the same manner, such as the illustrative forward biased orientation, i.e., the work function of the input conductors 16 is high relative to the work function of the common conductor 20.

In this configuration, when the two input conductors 16 are connected to an AC source 32, such as an inductive coil suitably coupled to a drive source (not shown in FIG. 18), with the second conductor 24 connected between the coil 32 in a center tap arrangement, and a suitable ground point, a full wave rectified DC output voltage is provided on the common conductor 20.

Figure 19:
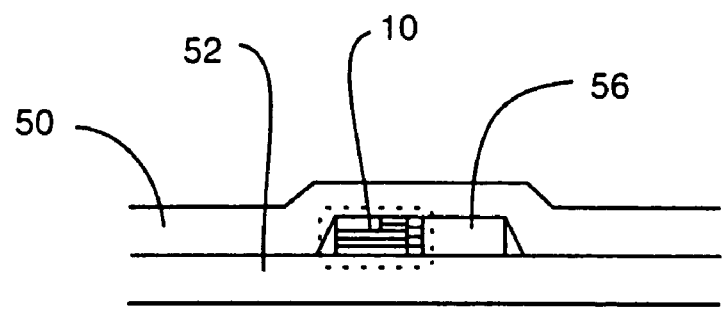

FIG. 19 shows the composite rectifying charge storage element 10 of the present invention, constructed in accordance with any one of the described embodiments, encapsulated within a flexible substrate such as a pair of layers 50 and 52 which may be formed from a suitable flexible material selected for quick and easy assembly as by lamination. The composite element 10 is substantially encased or sealed within and between the substrate layers 50 and 52 in operative relation with one or more electronic circuit components 56, such as components of an RFID tag system. The substrate layers 50 and 52, which may be provided in the form of a badge or wristband or the like, beneficially protect the composite element 10 and associated circuitry 56 against undesired degradation due to atmospheric exposure. This assembly may be fabricated in an inert environment or atmosphere, or in a substantial vacuum.

Figure 20:
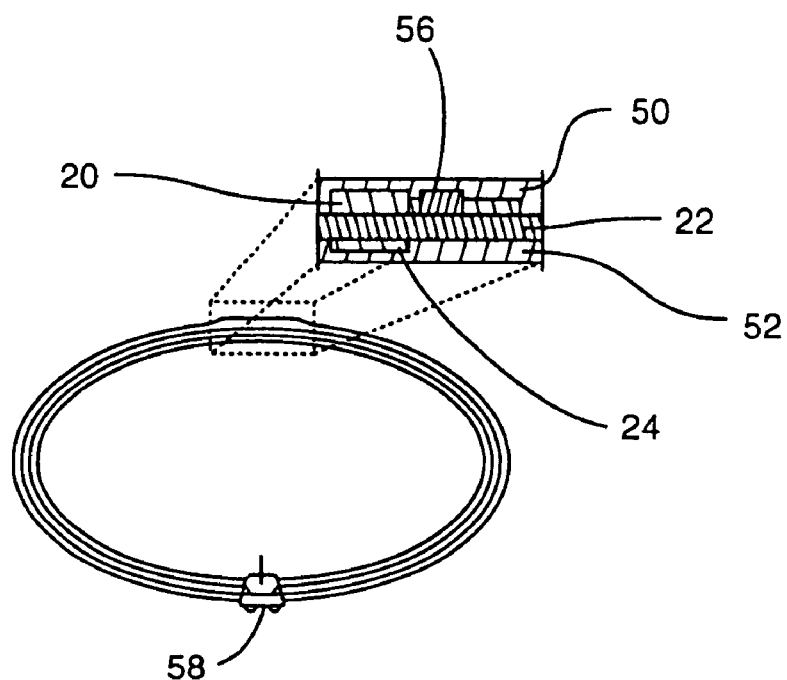
FIG. 20 is an end elevation view showing an exemplary flexible wristband, with an encapsulated rectifying charge storage element and related electronic circuitry carried thereby being illustrated in exploded and enlarged form.

FIG. 20 illustrates one preferred wristband embodiment of the assembled components shown in FIG. 19. As shown, the composite rectifying charge storage element 10 constructed in accordance with any one of the embodiment shown and described herein is substantially encased and sealed within and between substrate layers 50 and 52, and in operative relation with one or more circuit components 56. These substrate layers 50, 52 may incorporate an intermediate dielectric layer 22 forming the dielectric material maintaining the conductors 20 and 24 in spaced-apart relation. The trio of flexible layers 50, 52 and 22 are arrayed in an overlying elongated geometry suitable for use as a wristband or the like, with an appropriate fastening device 58 accommodated attachment of opposite free ends of the layers to form the desired closed loop configuration.

A variety of further modifications and improvements in and to the rectifying charge storage device of the present invention will be apparent to persons skilled in the art.

The invention claimed is:

1. A rectifying charge storage element, comprising:
a rectifier structure fabricated with a common conductor forming a side of the rectifier structure; and
a capacitor structure fabricated as a single unitary structure with the rectifier structure such that the capacitor structure incorporates the common conductor of the rectifier structure as a side of the capacitor structure, the capacitor structure to receive the rectified current from the rectifier structure via the common conductor;
said rectifier structure being selected from the group consisting of a Schottky diode, a light emitting diode, and a light responsive diode.

2. A rectifying charge storage element, comprising:
a rectifier structure fabricated with a common conductor forming a side of the rectifier structure; and
a capacitor structure fabricated as a single unitary structure with the rectifier structure such that the capacitor structure incorporates the common conductor of the rectifier structure as a side of the capacitor structure, the capacitor structure to receive the rectified current from the rectifier structure over the common conductor;
said capacitor structure being selected from the group consisting of a light emitting capacitor, a light responsive capacitor, a supercapacitor, and an electret.

3. A rectifying charge storage element, comprising:
a rectifier component;
a common conductor connected to one side of said rectifier component; and
a capacitor component incorporating said common conductor;
said rectifier component, common conductor and capacitor component comprising a unitary element;
said capacitor component comprising said common conductor, a second conductor, and a dielectric material disposed therebetween;
said common and second conductors respectively including first and second sets of fractal-shaped fingers arranged in closely spaced and substantially mating interleaved array.

4. The rectifying charge storage element of claim 3, wherein said first and second sets of fractal-shaped fingers have generally complementary shapes.

5. The rectifying charge storage element of claim 4, wherein said first set of fractal-shaped fingers have a generally L-shaped configuration, and wherein said second set of fractal-shaped fingers have a generally inverted L-shaped configuration.

6. The rectifying charge storage element of claim 3, wherein said rectifier component includes a semiconductor incorporated into said dielectric.

7. A rectifying charge storage element, comprising:
a rectifier component;
a common conductor connected to one side of said rectifier component; and
a capacitor component incorporating said common conductor;
said rectifier component, common conductor and capacitor component comprising a unitary element;
said capacitor component comprising an electrolytic capacitor.

8. The rectifying charge storage element of claim 7, wherein said electrolytic capacitor is polarized.

9. The rectifying charge storage element of claim 7, wherein said electrolytic capacitor is nonpolarized.

10. A rectifying charge storage element, comprising:
a rectifier component;
a common conductor connected to one side of said rectifier component; and
a secondary battery component incorporating said common conductor; and
said rectifier component, common conductor and secondary battery component comprising a unitary element.

11. A rectifying charge storage element, comprising:
a first rectifier component;
a second rectifier component;
a common conductor connected to one side of said first and second rectifier components; and
a capacitor component incorporating said common conductor;
said first and second rectifier components, said common conductor and said capacitor component comprising a unitary element.

12. The rectifying charge storage element of claim 11, wherein said first rectifier component includes a forward biased diode component, wherein said second rectifier component includes a reverse biased diode component.

13. The rectifying charge storage element of claim 11, wherein said first and second rectifier components respectively include a pair of diode components biased in a common direction.

14. The rectifying charge storage element of claim 11, wherein said first and second rectifier components respectively comprise first and second semiconductor diode components.

15. The rectifying charge storage element of claim 14, further including a first conductor, said first semiconductor diode component being located between said first conductor and said common conductor, a second conductor, said second semiconductor diode component being located between said second conductor and said common conductor, and further wherein said capacitor component comprises said common conductor, a third conductor, and a dielectric located between said common and third conductors.

16. The rectifying charge storage element of claim 15, wherein said first, second and third conductors are formed from materials respectively having a first, second and third work function, said first work function being greater than said third work function, and said third work function being greater than said second work function, whereby said first and second diode components are biased in oriented directions.

17. The rectifying charge storage element of claim 15, wherein said first, second and third conductors are formed from materials respectively having a first, second and third work function, said first and second work functions being selected relative to said third work function for biasing said first and second diode components in the same direction.

18. The rectifying charge storage element of claim 14, wherein said first and second semiconductor diode components comprise an organic material.

19. The rectifying charge storage element of claim 14, further including a substrate carrying said first and second rectifier components and said capacitor component.

20. The rectifying charge storage element of claim 19, wherein said substrate is a flexible substrate.

21. The rectifying charge storage element of claim 19, wherein said capacitor structure incorporates said substrate.

22. The rectifying charge storage element of claim 21, wherein said capacitor component comprises said common conductor, a third conductor, and a dielectric located between said common and third conductors, said substrate being incorporated into said dielectric.

23. A rectifying charge storage element, comprising:
a first anode conductor;
a second anode conductor;
a common conductor;
a first semiconductor connected between said first anode and common conductors;
a second semiconductor connected between said second anode and common conductors; and
a capacitor incorporating said common conductor on one side, said capacitor further including a second conductor and a dielectric connected between said common and second conductors;
said first and second semiconductors, common conductor and capacitor comprising a unitary composite device.

24. The rectifying charge storage element of claim 23, wherein said first anode conductor is formed from a material having a work function greater than said second conductor, and further wherein said second conductor is formed from a material having a work function greater than said second anode conductor, whereby said first and second semiconductors are oriented in opposite directions.

25. The rectifying charge storage element of claim 23, wherein said first and second anode conductors are formed from a material having a work function relative to said second conductor whereby said first and second semiconductors are biased in a common direction.

26. The rectifying charge storage element of claim 23, wherein said first and second semiconductors includes an organic material.

27. The rectifying charge storage element of claim 23, wherein said dielectric includes an organic material.

28. A rectifying charge storage element, comprising:
a rectifier structure fabricated with a common conductor forming a side of the rectifier structure;
a capacitor structure fabricated as a single unitary structure with the rectifier structure such that the capacitor structure incorporates the common conductor of the rectifier structure as a side of the capacitor structure, the capacitor structure to receive the rectified current from the rectifier structure over the common conductor; and
a common substrate carrying said rectifier and capacitor structures, said substrate including at least two layers of protective material laminated together with said rectifier and capacitor structures encased therebetween.

29. The rectifying charge storage element of claim 28, wherein said substrate is formed from a flexible material.

30. The rectifying charge storage element of claim 28, wherein said substrate is formed from a dielectric material.

31. The rectifying charge storage element of claim 28, wherein said substrate comprises an elongated flexible band having opposite free ends, and further including fastening means for interconnecting said opposite free ends to form said band into a closed loop configuration.

* * * * *

UNITED STATES PATENT AND TRADEMARK OFFICE
CERTIFICATE OF CORRECTION

| | | |
|---|---|---|
| PATENT NO. | : 7,187,055 B2 | Page 1 of 1 |
| APPLICATION NO. | : 11/193067 | |
| DATED | : March 6, 2007 | |
| INVENTOR(S) | : Michael L. Beigel | |

It is certified that error appears in the above-identified patent and that said Letters Patent is hereby corrected as shown below:

Column 13
In Claim 19, line 31, replace "claim 14" with -- claim 11 --.

Signed and Sealed this

Fifteenth Day of May, 2007

JON W. DUDAS
*Director of the United States Patent and Trademark Office*